United States Patent
Coutancier et al.

(10) Patent No.: US 7,477,525 B2
(45) Date of Patent: Jan. 13, 2009

(54) SYSTEM FOR MAINTAINING AN ASSEMBLY OF THREE PARTS IN POSITION THAT EXERTS A PREDETERMINED COMPRESSIVE FORCE ON THE INTERMEDIATE PART

(75) Inventors: Lionel Coutancier, Croisilles (FR); Sebastien Magnoux, Saint Gratien (FR)

(73) Assignee: Bull SAS, Paris (FR)

( * ) Notice: Subject to any disclaimer, the term of this patent is extended or adjusted under 35 U.S.C. 154(b) by 335 days.

(21) Appl. No.: 11/534,257

(22) Filed: Sep. 22, 2006

(65) Prior Publication Data

US 2007/0070612 A1 Mar. 29, 2007

(30) Foreign Application Priority Data

Sep. 23, 2005 (FR) .................... 05 09738

(51) Int. Cl.
H05K 7/14 (2006.01)
(52) U.S. Cl. .................. 361/801; 361/685; 361/724; 361/725; 361/726; 361/727
(58) Field of Classification Search ........... 361/801, 361/685, 724, 725, 726, 727
See application file for complete search history.

(56) References Cited

U.S. PATENT DOCUMENTS

| | | | |
|---|---|---|---|
| 5,706,965 A * | 1/1998 | Honma et al. ............. 220/4.02 |
| 6,588,866 B2 * | 7/2003 | Cheng ..................... 312/334.7 |
| 7,093,725 B2 * | 8/2006 | Hartman et al. ............. 211/26 |
| 7,164,579 B2 * | 1/2007 | Muncaster et al. .......... 361/685 |
| 2001/0040203 A1 * | 11/2001 | Brock et al. ........... 248/222.11 |
| 2003/0161114 A1 | 8/2003 | Berry et al. |
| 2003/0161130 A1 | 8/2003 | Yamamoto et al. |
| 2005/0017614 A1 * | 1/2005 | Cirocco et al. ............. 312/333 |

FOREIGN PATENT DOCUMENTS

DE 30 13 517 A1 10/1981

* cited by examiner

Primary Examiner—Jeremy C Norris
Assistant Examiner—Xiaoliang Chen
(74) Attorney, Agent, or Firm—Miles & Stockbridge P.C.; Eric G. King

(57) ABSTRACT

A system for maintaining an assembly of three aligned parts (1, 2, 3) in position, wherein a latching device (4) receives a joining member (6) integral with a rear part (1) of the assembly. The latching device (4) can slide on the joining member and is mounted inside a front part (3) and joined by springs (5) to the front part. The system includes means for moving the locking device, which engages with a locking element of the joining member (6) when the three parts (1, 2, 3) are joined, so as to move the device (4) rearward into a position (B) wherein the springs (5) exert a forward return force on the locking device. Retaining means inside the device (4) allow locking of the device in the second position and clamping of an intermediate part (2) between the front part (3) and the rear part (1).

19 Claims, 4 Drawing Sheets

SYSTEM FOR MAINTAINING AN ASSEMBLY OF THREE PARTS IN POSITION THAT EXERTS A PREDETERMINED COMPRESSIVE FORCE ON THE INTERMEDIATE PART

The present invention relates to the field of devices for assembling and joining computer servers composed of several parts with a centralized latch. More particularly, the invention concerns a system for maintaining an assembly of three parts in position that exerts a predetermined compressive force on the intermediate part.

In the field of computer servers, the conventional methods for joining an assembly use only two modules to mount a drawer in a computer cabinet. The rear part is attached to the frame of the bay or cabinet and ensures the wiring of the assembly to the rear of the bay. The two modules, which are similar to chassis, are solidly joined and are connected to one another by means of connectors. The continuity of the signals from one chassis to another can be ensured when the modules are kept solidly joined.

It is also possible to assemble three modules with an intermediate module attached by screws or similar fastening means to the two outer modules. However, the operator would encounter a number of drawbacks:

- once the server is assembled, accessing the screws is difficult since they are on the backs of the outer chassis;
- this requires being able to access the two opposite sides of the server, which complicates the job (resulting in increased maintenance costs) when the assembled server is located in a cabinet that is in the middle of a row in a computer room;
- the strength and rigidity of the assembly depend on the thickness of the walls of the intermediate chassis and on the size of the screws (affecting the weight and spaciousness of the chassis);
- the tightening force of the screws must be controlled, yet maintenance technicians do not generally have dynamometric screwdrivers;
- the screws/fasteners can get lost;
- the screws/fasteners take up space inside the chassis.

The inventors initially had the idea of using a fastening system that is extended, for example by tie rods, through the intermediate chassis so that nut-type fastening means are used only in one of the outer chassis. However, accessing the fasteners is still difficult. Moreover, such a system is bulky and it is not easy to adjust the compressive force to which the intermediate chassis is subjected. Consequently, the inventors had to create another type of solution that would allow easier maintenance and an adjustable mode of connection between chassis.

The object of the present invention is to eliminate one or more of the drawbacks of the prior art by offering a system for maintaining an assembly of three parts in position that is more practical to implement. Hereinafter it is understood that the intermediate part itself may be composed of several sub-parts, which may or may not be independent.

Another object of the invention is to propose a tool-free mode of assembly, making it possible to easily control the clamping force on the intermediate part.

These objects are achieved by means of a system for maintaining an assembly of three aligned parts in position, comprising at least one latching device for receiving a joining member integral with a first part of the assembly called the rear part, characterized in that the latching device, which is capable of sliding on the joining member, is mounted inside a second part of the assembly called the front part and joined by elastic return means to the front part, said system also comprising:

- means for moving the latching device disposed, when the parts of the assembly are in contact with or adjacent to one another, so as to engage with a locking element of the joining member and to drive the latching device rearward from a first, resting position to a second position of greater stress on the elastic return means wherein the latter exert a forward return force on the latching device; and
- retaining means in the latching device for retaining the joining member when the latching device occupies the second position, the intermediate part of the assembly being clamped between the front part and the rear part in this second position.

Thus, the invention advantageously proposes a means for holding the parts of the assembly together with a predetermined compression stress on the intermediate part.

According to another characteristic, said moving means can be operated so as to release the locking element and allow the latching device to return to its first position.

Thus, the invention offers a centralized mechanism that is practical and easy to use, without requiring access to the back of the assembly.

According to another characteristic, the retaining means include at least one latch provided for receiving a latch pin disposed on one end of the joining member, the latch comprising a catch mounted so as to be able to pivot between an open position of the latch that allows the latch pin to be received and a closed position of the latch that allows said latch pin to be retained.

According to another characteristic, the retaining means include a stop finger provided on a lever pivoting on an axis transverse to the alignment of the assembly, the stop finger being able to pivot between a raised position that allows the latching device to slide relative to the joining member integral with the rear part and a lowered position wherein the finger makes it possible, when the parts of the assembly are in contact with one another, to retain a lever pin formed on the joining member.

According to another characteristic, the joining member is extended in the direction of alignment of the assembly and includes the latch pin on a free end, the lever pin being set back from the latch pin.

According to another characteristic, the means for moving the latching device include a lever that can be operated manually, the elastic return means comprising at least one spring with a given stiffness and compression for exerting a predetermined compressive force on the intermediate part when the latching device is placed in its second position.

According to another characteristic, the joining member forms a fixed slide rail part on which slide, in particular, the intermediate part and the latching device, the joining member being laterally attached to the rear part of the assembly and extending along a length greater than the intermediate space occupied by the intermediate part of the assembly.

According to another characteristic, positioning pins are disposed between the rear part and the intermediate part and between the intermediate part and the front part so as to allow planar contact between the intermediate part and the other two parts of the assembly.

According to another characteristic, the latching device comprises a carriage equipped with grooves so as to slide inside a sheet metal chassis delimiting the front part, the elastic return means being attached at a first end to a support bracket integral with the carriage, and at a second end to a surface of the front part made to come into contact with the intermediate part of the assembly, these elastic return means comprising springs that extend, in said resting position, along a length of between 7 and 20 cm in the direction of alignment of the assembly.

Another object of the invention is to propose a use of the system in the context of the assembly of computer servers equipped with several parts (chassis).

To this end, the invention proposes a use of the system according to the invention, characterized in that the system is used to assemble and maintain parts of an assembly in position in a location that is directly accessible from only one side.

According to another characteristic, the system is used to assemble and maintain parts of a server in position inside a computer bay.

According to another characteristic, the use according to the invention comprises:

a manual operation for aligning the parts of the assembly;

an operation for placing the parts of the assembly in contact in pairs, making it possible to position a free end of the joining member, integral with the rear part, inside a housing of the latching device;

an operation for driving the means for moving the latching device in a first direction in order to translate the latching device and compress at least one spring of the elastic return means; and a latching operation by the retaining means of the latching device in order to maintain the compression of the springs.

According to another characteristic, a release is performed by driving the means for moving the latching device in a second direction opposite from the first direction, in order to translate the latching device so as to decompress the spring or springs.

Another object of the invention is to offer a chassis forming the front part of a server, adapted to facilitate the joining of the parts of the server and their maintenance in the connected position.

To this end, the invention proposes a front-end chassis of a server assembly with several aligned parts in the form of drawers, comprising at least one latching device for receiving a slide rail-type joining member integral with an opposite part of the server called the rear part, characterized in that the latching device, which is capable of sliding on the joining member, is joined by elastic return means to the chassis, the latching device also comprising:

moving means disposed so as to engage with the joining member and to drive a movement of the latching device from a first, resting position to a second position of greater stress on the elastic return means wherein the latter exert on the latching device a return force directed toward the front of the server; and retaining means for retaining the joining member when the latching device occupies the second position.

The invention, with its features and advantages, will emerge more clearly with the reading of the description given in reference to the attached drawings, in which.

Figures 6A, 6B:
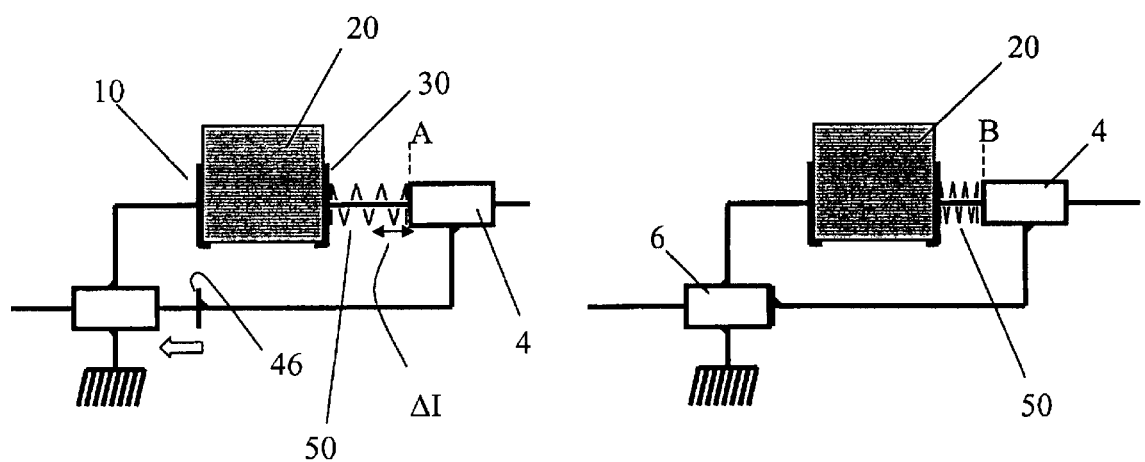
Figure 7:
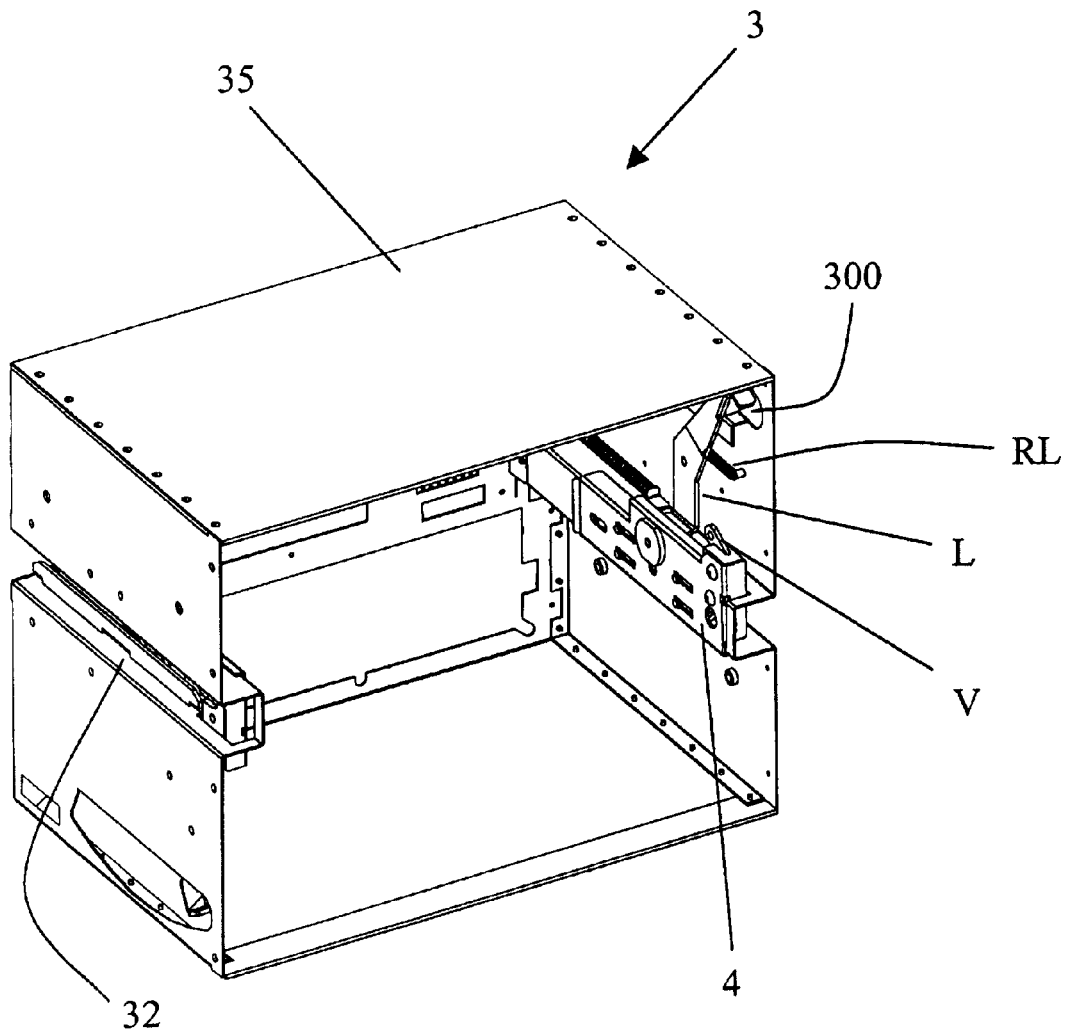
Figure 8:
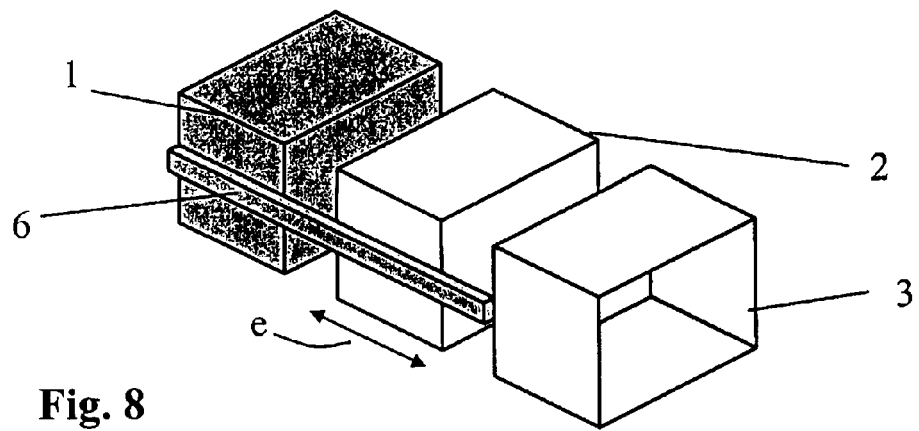

FIGS. 6A and 6B schematically illustrate, respectively before and after tightening, the clamping of the intermediate part of the assembly with a clamping force exerted only by a spring system;

FIG. 7 represents, in perspective, a front end chassis according to the invention incorporating the latching device;

FIG. 8 schematically illustrates the alignment of the parts or drawer-type chassis of a server.

Hereinafter, the term computer bay is intended to mean any high-density structure with equipment for use in data centers, network rooms or wiring cabinets. The invention advantageously applies to servers to be installed in computer bays, but can just as easily be used for any type of assembly with three aligned modules (10, 20, 30) that must be kept connected, as illustrated in FIGS. 6A and 6B.

Referring to FIG. 8, the assembly can be composed of three parts (1, 2, 3) similar to chassis and forming a drawer sliding on slide rails mounted on the part (1) that forms the rear chassis. In one embodiment of the invention, the drawer must be able to be mounted in a computer bay. These bays have a front end and a rear end into which all of the cables descend (called the cabling area). Conventionally in this field, the drawers are designed to always be mounted in the cabinets in the same direction, with the cable outlets in the cabling areas. The front end and the rear end are therefore clearly distinguished in all of the drawers. When the machine constituting the computer server is assembled, the three parts (1, 2, 3) include circuit boards, and the connectors installed in the connection planes between the three parts make it possible to ensure the continuity of the computer signals from one chassis to another.

It is understood that the front end chassis (3) illustrated in FIG. 8 is the end that is most accessible to an operator once the drawer is mounted in the computer bay. The outer faces of the front and rear parts can be removed in order to perform maintenance operations. When the drawer is mounted in a cabinet or computer bay, the rear part (1) is fastened to the frame of the bay, for example via slide rails so as to be able to come partially out of the module toward the front and toward the rear, thus facilitating certain maintenance operations. From the point of view of the mechanism for joining the three parts (1, 2, 3), the rear part (1) may therefore be considered to be the fixed part.

Referring to FIGS. 1 through 4, the system according to the invention for maintaining such an assembly in position comprises a centralized control that makes it possible both to ensure the connection between the parts (1, 2, 3) of the assembly and to keep the intermediate part (2) clamped between the front part (3) and the rear part (1).

Figure 1:
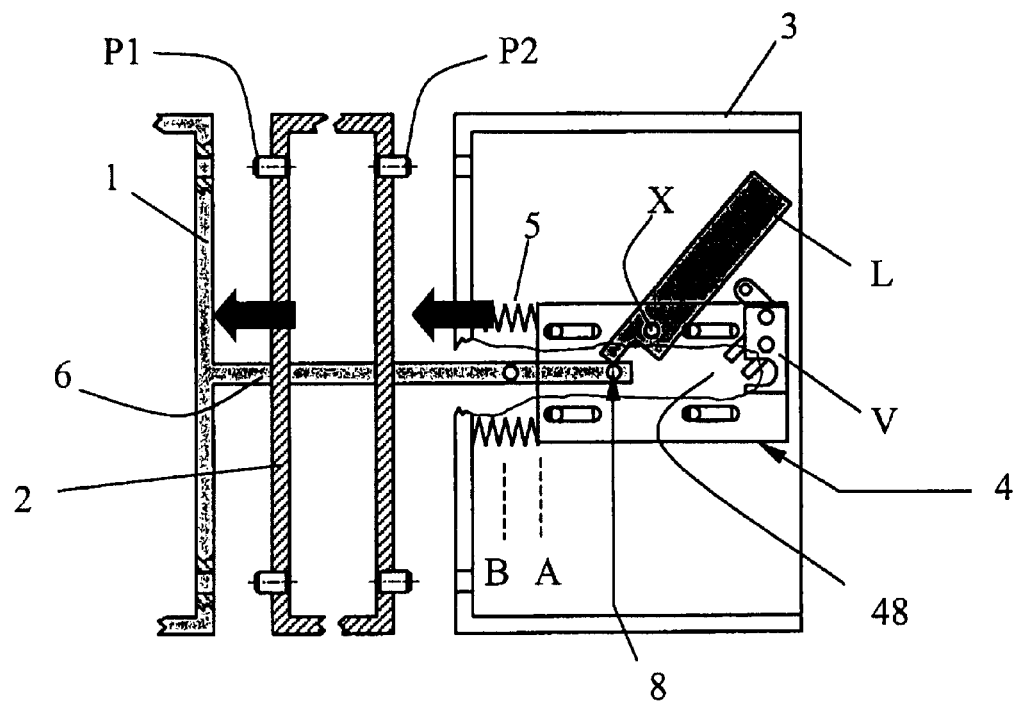
FIG. 1 shows a side view illustrating the assembly phase made possible with the system according to the invention.

As illustrated in FIG. 1, the three parts (1, 2, 3) are assembled so as to be aligned, particularly by means of anointing member (6) integral with the rear part (1). In a preferred embodiment of the invention, the joining member (6) is extended in the direction of alignment of the assembly and can constitute a fixed slide rail part. The moving parts (2, 3) have, for example, a groove adapted so as to slide on the fixed joining member (6) integral with the rear part (1). The assembly operation illustrated in FIG. 1 can consist of aligning the moving parts (2, 3), then bringing them to the fixed rear part (1). The rear part (1) is, for example, pre-cabled and attached to the rear of a computer bay (not represented).

The system for maintaining the assembly in position is equipped with at least one latching device (4) for receiving the joining member (6). This device (4) is capable of sliding on the joining member (6). The latching device (4) can be mounted inside the chassis forming the front part (1), as illustrated in FIG. 7. The sliding of the latching device (4) takes place, for example, via one or more grooves (32) disposed laterally on the outside of a chassis. A fixed slide rail part attached to the rear part (1) is inserted into this groove (32). The moving parts (2, 3) can include such grooves (32) in order to allow them to slide like a drawer.

In the example of FIGS. 1 through 4, the intermediate part (2) and the latching device (4) slide on the joining member (6). The latter is laterally attached to the rear part (1) of the assembly and extends along a length greater than the intermediate space (e) occupied by the intermediate part (2) of the assembly. Fixed runner parts can be provided laterally on both sides of the parts (1, 2, 3) of the assembly so as to fit into the corresponding grooves (32, FIG. 7).

Referring to FIGS. 1 through 4, the latching device (4) is mounted in the front part (3) and joined, particularly by elastic return means (5) to this front part (3). To use the system according to the invention in a computer bay, it is advantageous to place the latching device (4) on an end that is directly accessible by an operator (the front end in this case) in order to reduce the disassembly-reassembly time. The latching device (4) can move in translation relative to chassis of the part (3) on which it is mounted, between a first, resting position (A) and at least one second position (B) wherein the elastic return means are placed under more stress and exert a return force on the latching device (4), toward the front of the assembly. The latching device (4) can thus be propelled so as to stress the elastic return means (5) disposed, for example, longitudinally between a front face (34) of the front part (3) and the latching device (4).

In a nonlimiting way, the latching device (4) can include a carriage equipped with grooves (400) for sliding inside a sheet-metal chassis (35) that delimits the front part (3). The elastic return means (5) comprise, for example, one or more springs attached at a first end to a support bracket (44) integral with the carriage, and at a second end to a surface of the front part (3) made to come into contact with the intermediate part (2) of the assembly. These springs extend in the direction of alignment of the assembly, along a length of, for example, between 7 and 20 cm in said resting position (A). The stiffness of the springs can be on the order of 10 N/mm.

Figure 2:
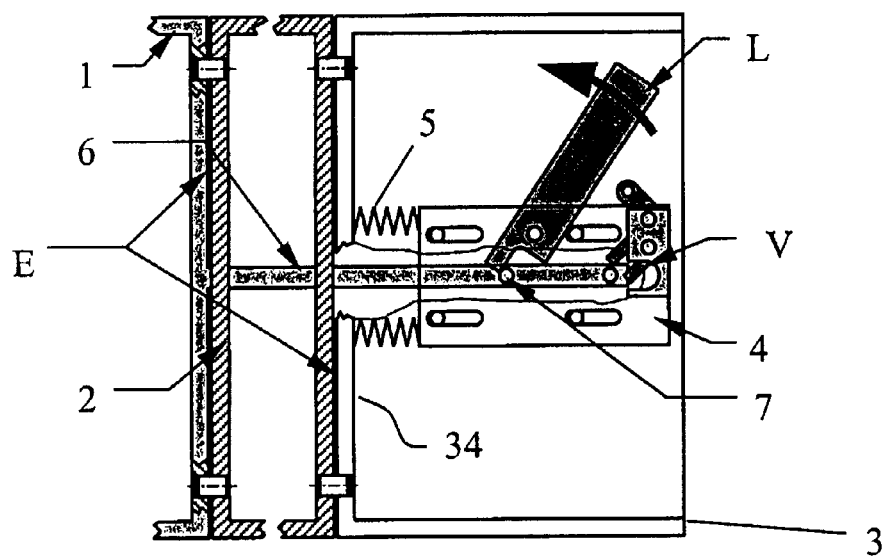
FIG. 2 shows a side view illustrating the system according to the invention during an initial phase of the operation of the lever.

The system according to the invention provides means (L, 47) for moving the latching device (4), which can be operated manually, in order to push the latching device (4) so as to stress the return means (5). These moving means (L, 47) are disposed so as to engage with a locking element of the joining member (6), when the parts (1, 2, 3) of the assembly are in contact with or adjacent to one another. The disposition of the joining member and these moving means (L, 47) is determined so that they can cooperate when the parts (1, 2, 3) of the assembly are superficially joined, as represented in FIG. 2. Said moving means (L, 47) then make it possible to produce a translational movement of the latching device (4) toward the rear. In the embodiment of FIGS. 1 through 4, the latching device (4) thus compresses the springs connected to the chassis that delimits the front part (3) until it reaches its second position (B). Positioning pins (P1, P2) can be disposed between the rear part (1) and the intermediate part (2) and between the intermediate part (2) and the front part (3) so as to allow planar contact between the intermediate part (2) and the other two parts (1, 3) of the assembly. These pins are, for example, mounted on the intermediate part (2), as illustrated in FIG. 1.

Retaining means (46, V) are also provided in the latching device (4) in order to retain the joining member (6) when the latching device occupies the second position (B). Because of the forward stress exerted by the elastic return means (5), the intermediate part (2) of the assembly is clamped between the front part (3) and the rear part (1) when the latching device (4) is brought into this second position (B).

Figure 3:
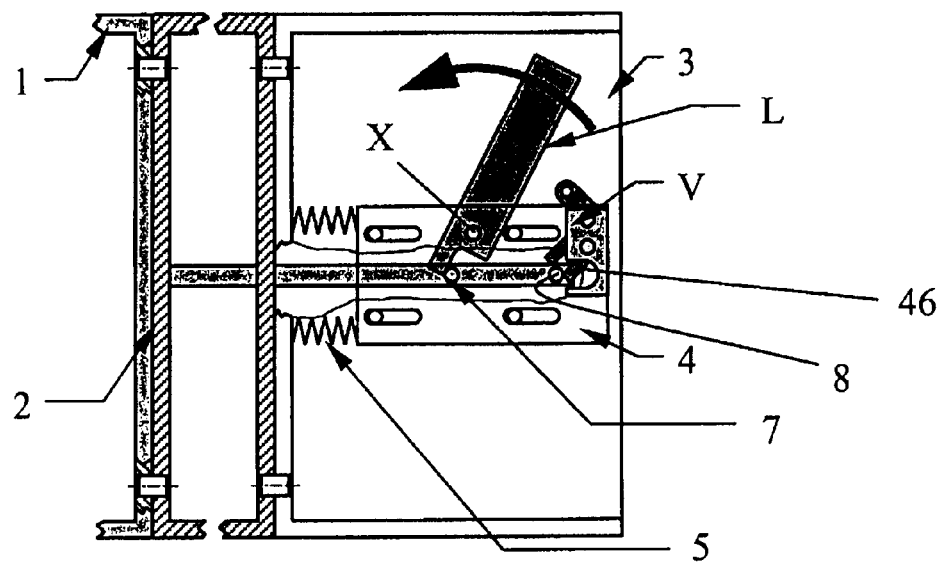
FIG. 3 shows a side view illustrating the compression phase made possible with the system according to the invention.
Figure 5:
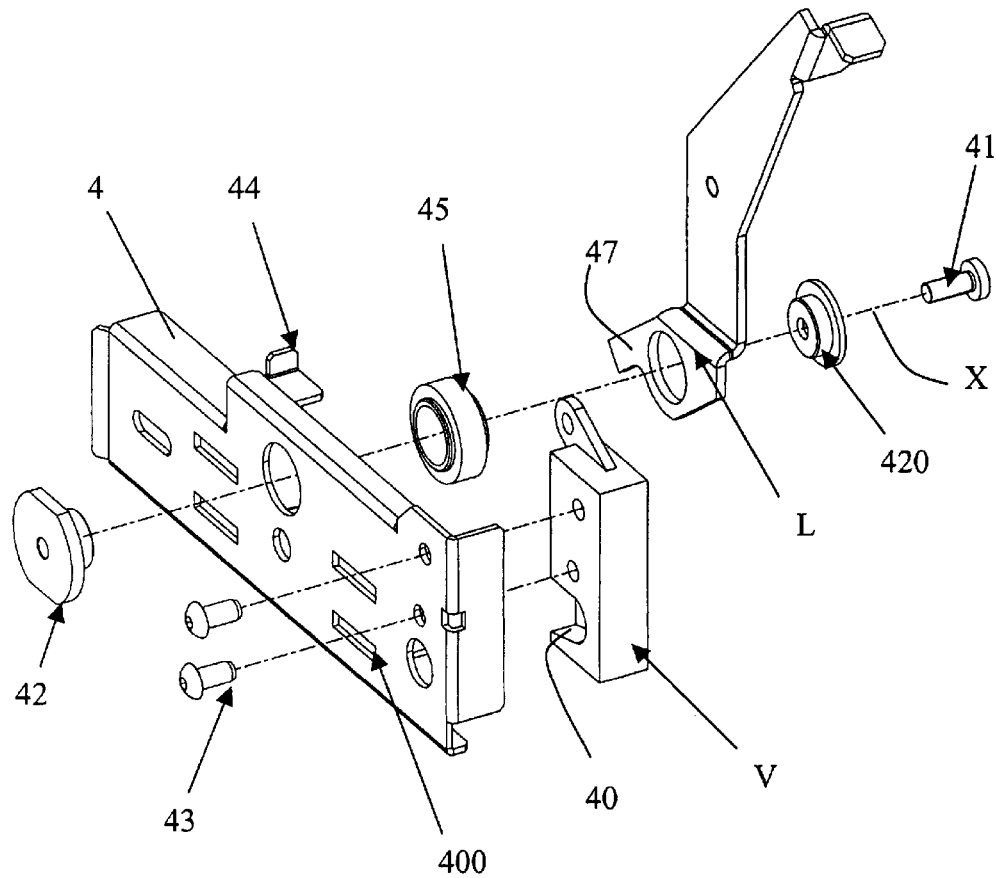
FIG. 5 represents an exploded view of a layout of the latching device according to one embodiment of the invention.

Referring to FIGS. 3 and 5, the retaining means (46, V) include at least one latch (V) provided for receiving a latch pin (8) disposed on one end of the [joining member] (6). The latch (V) comprises a catch (46) for receiving this latch pin. The catch is, for example, mounted so as to be able to pivot between an open position of the latch (V) that allows the latch pin (8) to be received and a closed position of the latch (V) that allows said latch pin (8) to be retained.

The sequence of FIGS. 1 through 4 illustrates the various phases for producing the assembly using the system according to the invention. Thus, after the manual operation for aligning the parts (1, 2, 3) of the assembly according to the illustration in FIG. 1, followed by the operation for placing the parts (1, 2, 3) of the assembly in contact in pairs, the operator has only to perform a latching operation that comprises:

an operation for driving the means (L, 47) for moving the latching device (4) in a first direction in order to translate the latching device (4) and compress at least one spring of the elastic return means (5); and an actual latching by means of the retaining means (46, V) of the latching device (4) in order to maintain the compression of the springs.

The operator therefore has only to join the three parts (1, 2, 3) enough so that the lever (L) can engage with the lever pin (8). Thus, once the spaces (E) between the parts (1, 2, 3) have been roughly minimized, the only thing left to do is to manually actuate the lever (L) until it snaps into place in order to eliminate any play and establish a reliable connection between the parts, with a controlled compressive force. As illustrated in FIG. 7, the lever (L) can be made accessible through the sheet metal chassis (35) that delimits the front part (3), via an appropriate slot (300), while the latching device is incorporated into the internal volume of the chassis (35). A spring (RL) for returning the lever (L) to its initial position can also be disposed along the internal wall of the chassis (35).

The means (L, 47) for moving the latching device (4) can be operated so as to release the locking element of the joining member (6) and cause the latching device (4) to return to its first position (A). A release is thus made possible by simply driving the means (L, 47) for moving the latching device (4) in a second direction opposite from the first direction, in order to translate the latching device (4) so as to decompress the spring or springs.

In the embodiment of FIGS. 1 and 5, these moving means comprise a lever (L) that can be operated manually. This type of lever can be equipped, for example on its bottom part, with a stop finger (47, FIG. 4) that pivots with the lever (L) along an axis (X) transverse to the alignment of the assembly. The retention of the latching device (4) in the second position (B) is made possible, in particular, by this stop finger (47), which can pivot between a raised position that allows the latching device (4) to slide relative to the joining member (6) integral with the rear part (1) and a lowered position. This lowered position of the stop finger (47) makes it possible, when the parts (1, 2, 3) of the assembly are in contact with one another, to retain the lever pin (7) formed on the joining member (6). Naturally, the disposition of the lever pin (7) is predetermined, as illustrated in FIGS. 2 through 4, so that the position of this pin (7) coincides with the stop finger when the assembly of the three parts (1, 2, 3) is formed.

Referring to FIG. 3, the compression phase can then be initiated, by acting on the lever (L) so as to push the latching device (4). The pressure exerted on the latching device (4) makes it possible to return the joining member (6) completely into the housing (48) of the latching device (4), all the way to the catch (46). The latch pin (8) located on the free end of the joining member (6) is then retained by the latch (V), as illustrated in FIG. 4. The lever (L) occupies a vertical position and the stop finger (47) is disposed behind the lever pin (7). In other words, the joining member is held in place by both the stop finger (47) and the lever (L) and by the latch (V). The lever pin (7) is set back from the latch pin, at a distance of a few centimeters for example.

Figure 4:
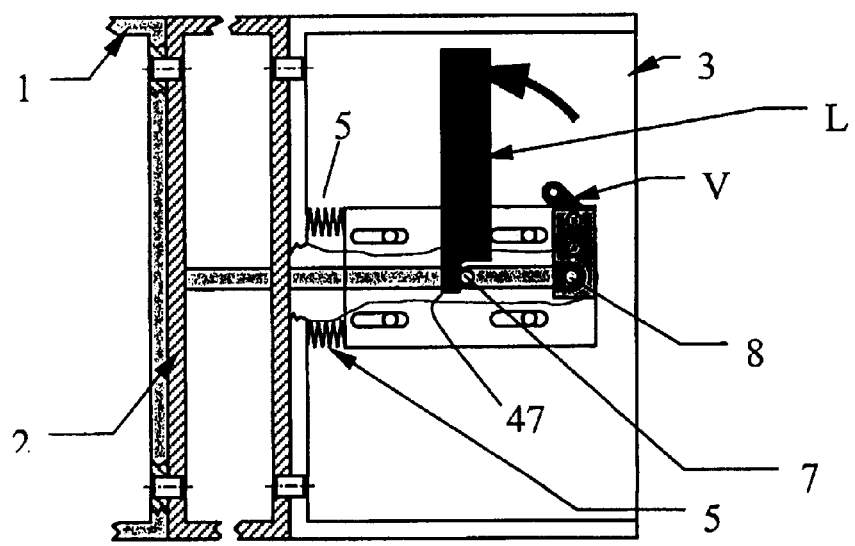
FIG. 4 shows a side view illustrating the latching phase made possible with the system according to the invention.

As illustrated in FIGS. 4 and 6B in particular, the elastic return means (5) comprise at least one spring with a given stiffness and compression (ΔI) for exerting this predetermined compression on the intermediate part or module (2, 20) of the assembly when the latching device (4) is placed in its second position (B). In the second position (B), the tightening force of the "clamp" is always under control as a result of the system of the invention. In fact, it depends only on the stiffness of the spring, the compression of the spring (ΔI), and the number of springs used (the springs chosen can be identical).

In the embodiment of FIG. 5, the latching device (4) moves relative to the front part (3) by means of grooves (400) delimiting an authorized translation distance. These grooves (400) are passed through by pins or equivalent male parts formed on a guide of the device (4). The guide is mounted on the front part (3) and makes it possible to delimit the end positions (A, B) that can be assumed by the latching device (4). The latch (V) is joined to the carriage part of the device (4) by screws (43) or any other equivalent fastening means. The lever (L) is mounted so as to pivot on this carriage part along the pivot axis (X). A flanged washer (420) and a specific nut make it possible, in combination with a mounting screw, to join the lever to the carriage part. A lever barrel (45) is also disposed against the perforated zone of the lever (L).

One of the advantages of the invention is to allow a tool-free assembly and disassembly of the server, even when it is installed in a bay, by means of a simple action on the lever (L) that controls the connection between the modules of the server in a centralized fashion. Thus, maintenance times are reduced as a result of the centralized mechanism for maintaining the three parts (1, 2, 3) in position, which is accessible from one end of the server drawer (the most easily accessible end, which is generally the front end).

Another advantage of the invention is that it provides a solution that accommodates all of the assembly and connection constraints of a three-part server drawer. Thus, the parts (1, 2, 3) can be joined with enough rigidity in the assembly to ensure stable connections between the circuit boards. The mechanical strength of the assembly is ensured and the compressive force to which the center or intermediate part (2) is subjected is controlled.

The system according to the invention can be used, for example, to assemble and maintain the parts (1, 2, 3) of an assembly in position in a location that is directly accessible from only one side. In particular, it is understood that the system makes it possible to assemble and maintain parts (1, 2, 3) of a server in position inside a computer bay.

It should be obvious to those skilled in the art that the present invention allows for many other specific embodiments without going beyond the scope of application of the invention as claimed, and that the invention should not be limited to the details given above.

The invention claimed is:

1. A system for maintaining an assembly of three aligned parts including a first rear part (1), a second front part (3) and an intermediate part (2) in position, comprising:
   at least one latching device (4) for receiving a joining member (6) integral with the first rear (1) part of the assembly and having a locking element, the latching device (4) being capable of sliding movement on the joining member (6), and being mounted inside the second front part (3) of the assembly, elastic return means (5) joining the latching device (4) to the front part (3);
   means (L, 47) for moving the latching device (4) disposed, when the first, second and third parts (1, 2, 3) of the assembly are in contact with or adjacent to one another, so as to engage with the locking element of the joining member (6) and to drive the latching device (4) rearward from a first resting position (A) to a second position (B) of greater stress on the elastic return means (5) wherein the elastic return means (5) exert a forward return force on the latching device (4); and
   retaining means (46, V) in the latching device (4) for retaining the joining member (6) when the latching device (4) occupies the second position (B), the intermediate part (2) of the assembly being clamped between the front part (3) and the rear part (1) in said second position.

2. A system according to claim 1, wherein said means for moving (L, 47) is operable so as to release the locking element and allow the latching device (4) to return to its first position (A).

3. A system according to claim 1, wherein the retaining means (46, V) include at least one latch (V) provided for receiving a latch pin (8) disposed on one end of the joining member (6), a catch (46) on the latch (V) mounted so as to pivot between an open position of the latch (V) that allows the latch pin (8) to be received and a closed position of the latch (V) that allows said latch pin (8) to be retained.

4. A system according to claim 1, wherein the retaining means (46, V) include a stop finger (47) provided on a lever (L) pivoting on an axis (X) transverse to the alignment of the assembly, the finger (47) being able to pivot between a raised position that allows the latching device (4) to slide relative to the joining member (6) integral with the rear part (1) and a lowered position wherein the finger (47) makes it possible, when the first, second and third parts (1, 2, 3) of the assembly are in contact with one another, to retain a lever pin (7) formed on the joining member (6).

5. A system according to claim 4, wherein the joining member (6) is extended in the direction of alignment of the assembly and includes the latch pin (8) on a free end, the lever pin (7) being set back from the latch pin (8).

6. A system according to claim 1, wherein the means for moving the latching device (4) includes a manually operated lever (L), the elastic return means (5) comprising at least one spring having a given stiffness and compression (ΔI) for exerting a predetermined compressive force on the intermediate part (2) when the latching device (4) is placed in its second position (B).

7. A system according to claim 1, wherein the joining member (6) forms a fixed slide rail part on which slide, in particular, the intermediate part (2) and the latching device (4), the joining member (6) being laterally attached to the rear part (1) of the assembly and extending along a length greater than the intermediate space (e) occupied by the intermediate part (2) of the assembly.

8. A system according to claim 1, wherein positioning pins (P1, P2) are disposed between the rear part (1) and the intermediate part (2) and between the intermediate part (2) and the front part (3) so as to allow planar contact between the intermediate part (2) and the other two parts (1, 3) of the assembly.

9. A system according to claim 1, wherein the latching device (4) comprises a carriage having grooves (400) so as to slide inside a sheet metal chassis (35) delimiting the front part (3), the elastic return means (5) being attached at a first end to a support bracket (44) integral with the carriage, and at a second end to a surface of the front part (3) made to come into contact with the intermediate part (2) of the assembly, said elastic return means (5) comprising springs that extend, in said resting position (A), along a length of between 7 and 20 cm in the direction of alignment of the assembly.

10. A method for maintaining an assembly of three parts (1, 2, 3) comprising using a system according to claim 1, comprising assembling and maintaining parts (1, 2, 3) of the assembly in a position and in a location that is directly accessible from only one side.

11. A method according to claim 10, wherein the system is used to assemble and maintain parts (1, 2, 3) of a server in position inside a computer bay.

12. A method for maintaining an assembly of three parts (1, 2, 3), comprising:
 a manually aligning the three parts (1, 2, 3) of the assembly;
 placing the three parts (1, 2, 3) of the assembly in contact in pairs, a free end of a joining member (6), integral with a rear part (1), inside a housing (48) of a latching device (4);
 driving the latching device (4) in a first direction in order to translate the latching device (4) and compress at least one spring of an elastic return means (5); and
 latching a retaining means (46, V) of the latching device (4) to maintain compression of at least one spring.

13. A method according to claim 12, further including releasing the latching device (4) in a second direction opposite from the first direction, in order to translate the latching device (4) so as to decompress at least one spring.

14. A front-end chassis (35) of a server assembly comprising several aligned parts (1, 2, 3) in the form of drawers, at least one latching device (4) for receiving a slide rail-type joining member (6) integral with an opposite rear part of the server the latching device (4), which is capable of sliding on the joining member (6), is joined by elastic return means (5) to the chassis (3), the latching device (4) also comprising:
 moving means (L, 47) disposed so as to engage with the joining member (6) and to move the latching device (4) from a first resting position (A) to a second position (B) of greater stress on the elastic return means (5) wherein the exerts return means on the latching device (4) a return force directed toward the front of the server; and
 retaining means (46, V) for retaining the joining member (6) when the latching device (4) occupies the second position (B).

15. A system according to claim 2, wherein the retaining means (46, V) include at least one latch (V) provided for receiving a latch pin (8) disposed on one end of the joining member (6), a catch (46) on the latch (V) mounted so as to pivot between an open position of the latch (V) that allows the latch pin (8) to be received and a closed position of the latch (V) that allows said latch pin (8) to be retained.

16. A system according to claim 3, wherein the retaining means (46, V) include a stop finger (47) provided on a lever (L) pivoting on an axis (X) transverse to the alignment of the assembly, the finger (47) being able to pivot between a raised position that allows the latching device (4) to slide relative to the joining member (6) integral with the rear part (1) and a lowered position wherein the finger (47) makes it possible, when the first, second and third parts (1, 2, 3) of the assembly are in contact with one another, to retain a lever pin (7) formed on the joining member (6).

17. A front end chassis as set forth in claim 14, wherein retaining means (46, V) include at least one latch (V) provided for receiving a latch pin (8) disposed on one end of the joining member (6), a catch (46) on the latch (V) mounted so as to pivot between an open position of the latch (V) that allows the latch pin (8) to be received and a closed position of the latch (V) that allows said latch pin (8) to be retained.

18. A front end chassis as set forth in claim 14, wherein said means for moving (L, 47) so as to release the locking element and allow the latching device (4) to return to its position (A).

19. A front end chassis as set forth in claim 14, wherein the retaining means (46, V) include a stop finger (47) provided on a lever (L) pivoting on an axis (X) transverse to the alignment of the assembly, the finger (47) being able to pivot between a raised position that allows the latching device (4) to slide relative to the joining member (6) integral with the rear part (1) and a lowered position wherein the finger (47) makes it possible, when the first, second and third parts (1, 2, 3) of the assembly are in contact with one another, to retain a lever pin (7) formed on the joining member (6).

* * * * *